(12) United States Patent
Theertham et al.

(10) Patent No.: US 11,509,266 B2
(45) Date of Patent: Nov. 22, 2022

(54) VOLTAGE-CONTROLLED OSCILLATOR (VCO) WITH LC CIRCUIT AND SERIES RESISTORS

(71) Applicant: Texas Instruments Incorporated, Dallas, TX (US)

(72) Inventors: Srinivas Theertham, Bengaluru (IN); Srikanth Manian, Bengaluru (IN); Uday Kiran Meda, Hyderabad (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/493,922

(22) Filed: Oct. 5, 2021

(65) Prior Publication Data

US 2022/0038056 A1 Feb. 3, 2022

Related U.S. Application Data

(63) Continuation of application No. 16/942,230, filed on Jul. 29, 2020, now Pat. No. 11,171,601.

(51) Int. Cl.
*H03B 5/12* (2006.01)
*H03L 7/099* (2006.01)

(52) U.S. Cl.
CPC ......... *H03B 5/1212* (2013.01); *H03B 5/1221* (2013.01); *H03B 5/1228* (2013.01); *H03B 5/1253* (2013.01); *H03L 7/099* (2013.01); *H03B 2200/009* (2013.01)

(58) Field of Classification Search
CPC ...... H03B 5/12; H03B 5/1206; H03B 5/1209; H03B 5/1212; H03B 5/1215; H03B 5/1221; H03B 5/1228; H03B 5/1231; H03B 5/1237; H03B 5/124; H03B 5/1243; H03B 5/1246; H03B 5/125; H03B 5/1253; H03B 5/1256; H03B 5/1262; H03B 5/1265; H03B 5/1268; H03B 5/1275; H03B 5/1287; H03B 2200/009; H03L 7/099
See application file for complete search history.

(56) References Cited

U.S. PATENT DOCUMENTS

| | | |
|---|---|---|
| 6,124,766 A | 9/2000 | Matsuura |
| 9,515,605 B1 | 12/2016 | Madala et al. |
| 9,559,667 B1 | 1/2017 | Chakrabarti et al. |
| 2005/0281193 A1 | 12/2005 | Hofmeister et al. |
| 2007/0132521 A1 | 6/2007 | Lee et al. |
| 2008/0111644 A1 | 5/2008 | Jang et al. |
| 2010/0289592 A1 | 11/2010 | Lee et al. |
| 2012/0249250 A1 | 10/2012 | Cheng et al. |
| 2020/0228059 A1 | 7/2020 | Kenyon |

*Primary Examiner* — Levi Gannon
(74) *Attorney, Agent, or Firm* — John R. Pessetto; Charles A. Brill; Frank D. Cimino

(57) ABSTRACT

A system includes a data path and a phase-locked loop (PLL) coupled to the data path. The system also includes a voltage-controlled oscillator (VCO) coupled to the PLL. The VCO includes an LC circuit with first and second differential output terminals. The VCO also includes a first resistor coupled between the first differential output terminal and drain terminals of a first pair of complementary metal-oxide semiconductor (CMOS) transistors. The VCO also includes a second resistor coupled between the second differential output terminal and drain terminals of a second pair of CMOS transistors.

12 Claims, 5 Drawing Sheets

VOLTAGE-CONTROLLED OSCILLATOR (VCO) WITH LC CIRCUIT AND SERIES RESISTORS

CROSS REFERENCE TO RELATED APPLICATION(S)

This continuation application claims priority to U.S. patent application Ser. No. 16/942,230, filed Jul. 29, 2020, which application is incorporated herein by reference in its entirety.

BACKGROUND

The proliferation of electronic devices and integrated circuit (IC) technology has resulted in the commercialization of IC products. As new electronic devices are developed and IC technology advances, new IC products are commercialized. One example IC product that is needed in electronic devices is a voltage-controlled oscillator (VCO). In one example VCO, an LC circuit is combined with IC transistors to provide an output frequency as a function of a voltage differential.

One of the issues with LC-based VCO topologies is that the LC circuit gets clamped to the supply voltages (VDD-VSS), which degrades VCO performance by increasing the phase noise (adding harmonic components) which up-converts 1/f noise. Also, some LC-based VCO topologies have increased frequency drift with respect to temperature across process corners.

SUMMARY

In accordance with at least one example of the description, a system comprises a data path and a phase-locked loop (PLL) coupled to the data path. The system also includes a voltage-controlled oscillator (VCO) coupled to the PLL. The VCO includes an LC circuit with first and second differential output terminals. The VCO also includes a first resistor coupled between the first differential output terminal and drain terminals of a first pair of complementary metal-oxide semiconductor (CMOS) transistors. The VCO also includes a second resistor coupled between the second differential output terminal and drain terminals of a second pair of CMOS transistors.

In accordance with at least one example of the description, a VCO comprises a first pair of CMOS transistors with a first terminal between drain terminals of the first pair of CMOS transistors. The VCO also comprises a second pair of CMOS transistors with a second terminal between drain terminals of the second pair of CMOS transistors. The VCO also comprises a first resistor, an LC circuit, and a second resistor coupled in series between the first and second terminals.

In accordance with at least one example of the description, an integrated circuit comprises VCO. The VCO comprises a first differential output terminal and a second differential output terminal. The VCO also comprises an inductor and a capacitor in parallel between the first and second differential output terminals. The VCO also comprises a first resistor coupled between the first differential output terminal and drain terminals of a first pair of CMOS transistors. The VCO also comprises a second resistor coupled between the second differential output terminal and drain terminals of a second pair of CMOS transistors.

DETAILED DESCRIPTION

Described herein is an inductor-capacitor (LC)-based VCO topology suitable for integrated circuit (IC) implementation while achieving target performance criteria such as output frequency, small signal gain, and phase noise without a significant increase in complexity and cost. In some examples, an LC-based VCO with the described topology is part of a phase-locked loop (PLL) used in a communication link device or IC with a data path. As used herein, "a communication link device" is a device used for data transmissions between at least two other devices. In different examples, a communication link device supports wireless or wired data transmissions between the at least two other devices. In some examples, the PLL is part of a clock and data recovery (CDR) circuit coupled to the data path, where the VCO provides its output (e.g., a differential signal at 6-12 GHz) to the data path.

In some examples, the VCO includes an LC circuit (L and C in parallel) with first and second differential output terminals. The VCO also includes a first resistor coupled between the first differential output terminal and drain terminals of a first pair of CMOS transistors. The VCO also includes a second resistor coupled between the second differential output terminal and drain terminals of a second pair of CMOS transistors. The VCO also includes: a first terminal between drain terminals of the first pair of CMOS transistors; and a second terminal between drain terminals of the second pair of CMOS transistors. In the described VCO topology, the first resistor, the LC circuit, and the second resistor are in series between the first and second terminals.

With the described VCO topology, IC design targets for noise, power, and area are achieved. Example targets for the VCO include noise below −106 dBc/rt (Hz) at 1 MHz offset and 12 GHz carrier, and power consumption below 30 mA, which facilitates system-on-a-chip (SoC) solutions. To provide a better understanding, various VCO options and related issues are described using the figures as follows.

Figure 1:
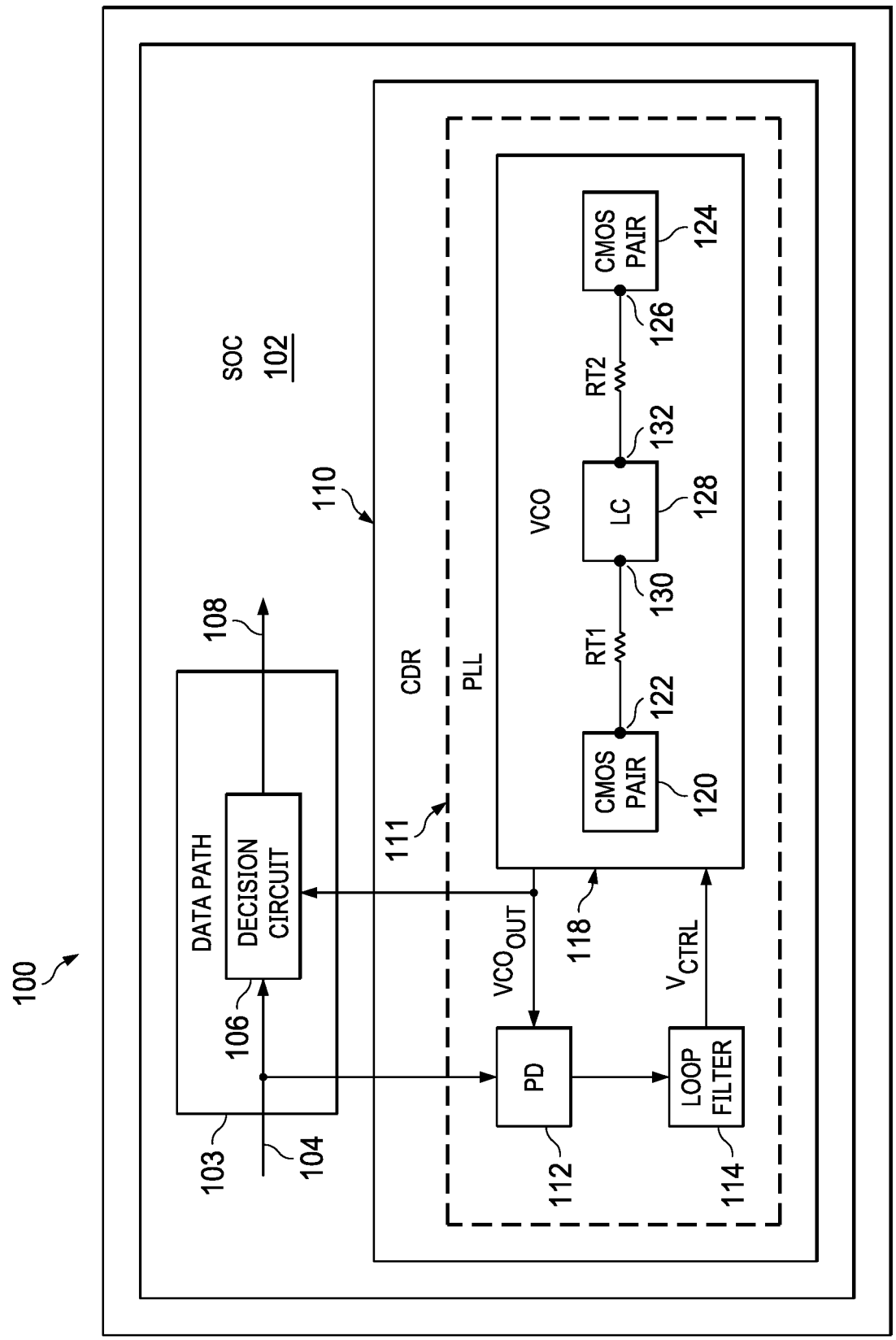
FIG. 1 is a block diagram showing an electrical system with a voltage-controlled oscillator (VCO) in accordance with some examples.

FIG. 1 is a block diagram showing an electrical system 100 with a voltage-controlled oscillator (VCO) 118 in accordance with some examples. In some examples, the electrical system 100 corresponds to communication link product that includes a system-on-a-chip (SoC) 102, where the SoC 102 includes a data path 103 with a decision circuit 106 coupled to a clock and data recovery (CDR) circuit 110. As shown, the CDR circuit 110 includes a PLL 111 with a VCO 118 as described herein. In different examples, the data path 103 includes repeater components, serializer components, and/or de-serializer components. Some example components of the data path 103 includes buffers, multiplexers, demultiplexers, and control logic. Example operations of the data path 103 include amplifying a received data signal 104, repeating a received data signal 104, serializing a received data signal 104, or de-serializing a received data signal 104, resulting in an output signal 108. Also, the output data signal 104 results from the operations of the decision circuit 106, which is based on a clock signal ($VCO_{OUT}$) generated by the VCO 118 described herein. Example devices or circuits with the data path 103 and the CDR include a communication link device (e.g., a transmitter, a receiver, a transceiver, a serializer/deserializer (SERDES), or a repeater). As used herein, a "serializer/deserializer" refers to a circuit that converts data from serial data to parallel data or vice versa. In different examples, a serializer/deserializer performs one-way conversions (e.g., serial-to-parallel in one direction or parallel-to-serial in one direction). In other examples, a serializer/deserializer performs two-way conversions (e.g., serial-to-parallel in one direction and parallel-to-serial in the other direction). Other two-way conversions are possible as well (e.g., serial-to-parallel in both directions or parallel-to-serial in both directions).

In some examples, the system 100 or SoC 102 performs transmitter operations. In such examples, the system 100 or SoC 102 includes processors, sensors, and/or memory configured to provide the data signal 104 to the data path 103. Additionally or alternatively, the system 100 or SoC 102 performs receiver operations. In such examples, the system 100 or SoC 102 includes processor and/or memory configured to receive and process data signals from the data path 103. In the example of FIG. 1, The VCO 118 is configured to provide $VCO_{OUT}$ with a frequency that varies as a function of an input voltage signal ($V_{CTRL}$), which is controlled by a loop having a phase-detector 111, a loop filter 114, and the VCO 118. As shown, $VCO_{OUT}$ is one of the inputs to phase-detector (PD) 112 of the PLL 111. The other input to the PD 112 is provided by the data path 103. In some examples, the loop of the PLL 111 is configured to adjust $V_{CTRL}$ to maintain the frequency of $VCO_{OUT}$ at a fixed value based on parameters such as a temperature value, a power supply value, control signals and/or other adjustment parameters. In other examples, the loop of the PLL 111 adjusts $V_{CTRL}$ to vary the frequency of $VCO_{OUT}$ according to a particular control scheme. As an example, the frequency of $VCO_{OUT}$ could be varied depending on a target data rate for the system 100, the SoC 102, or data signaling In the example of FIG. 1, the VCO 118 includes a first pair of CMOS transistors 120 with a first terminal 122, where the first terminal 122 is between the drain terminals of the first pair of CMOS transistors (see e.g., the first terminal 122A in FIG. 6). The VCO 104 also includes a second pair of CMOS transistors 124 with a second terminal 126 between drain terminals of the second pair of CMOS transistors (see e.g., the second terminal 126A in FIG. 6). The VCO 108 also includes a first resistor (RT1), an LC circuit 128, and a second resistor (RT2) coupled in series between the first and second terminals 122 and 126. The LC circuit 128 includes an inductor (L) in parallel with a capacitor (C), where first and second differential output terminals 130 and 132 of the VCO 108 are on opposite sides of the LC circuit 128. More specifically, RT1 is between the first terminal 122 and the first differential output terminal 130, and RT2 is between the second terminal 126 and the second differential output terminal 132. With RT1 and RT2 in series with the LC circuit 128, surge protection is provided, which ensures the VCO 108 complies with target performance criteria such as phase noise, small signal gain, and frequency drift as a function of temperature variation. For at least some target performance criteria, the described topology for the VCO 108 is an improvement over other LC-based VCO topologies.

Figure 2:
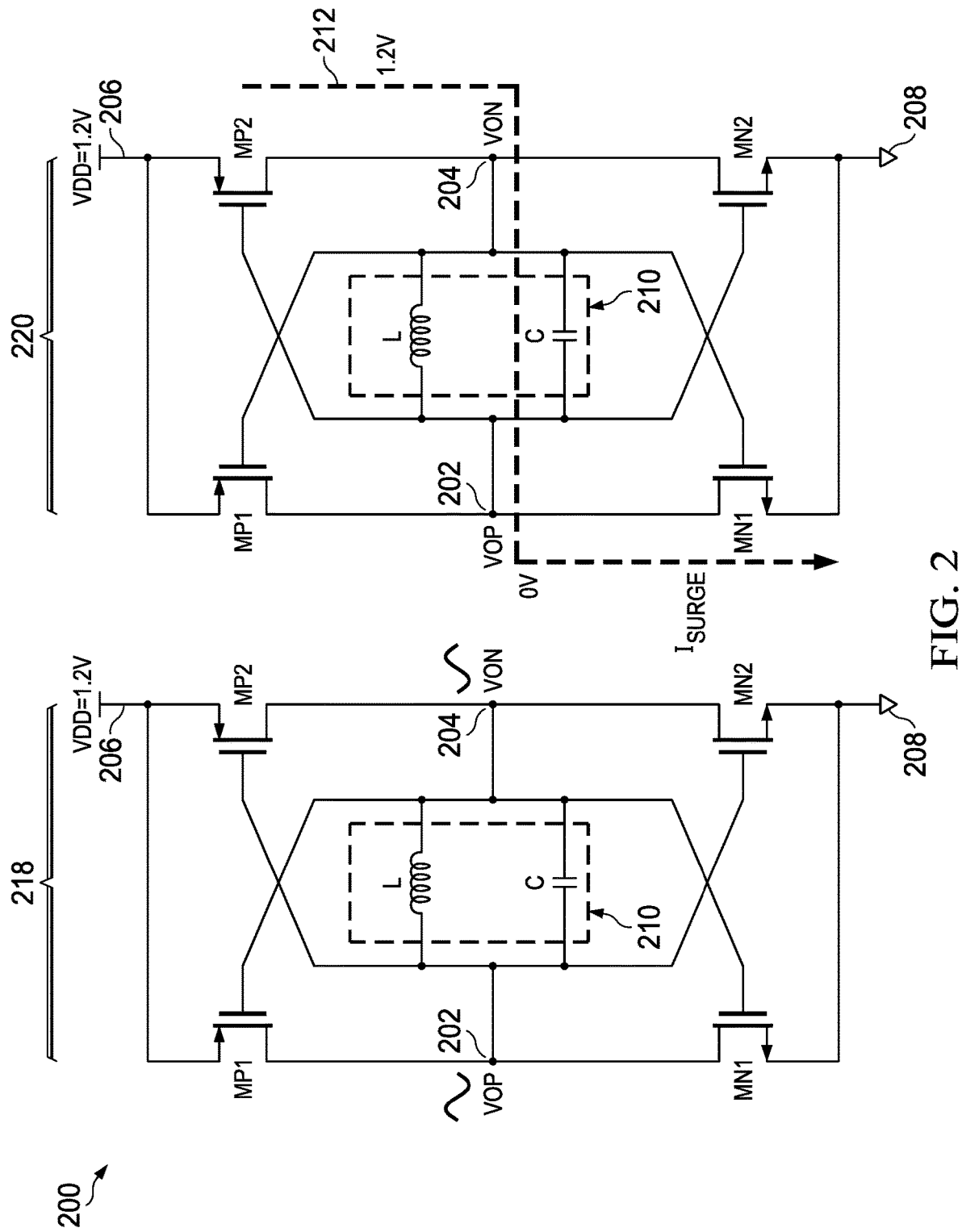
FIG. 2 is a block diagram showing a first LC-based VCO that does not comply with target performance criteria.

FIG. 2 is a block diagram showing a first LC-based VCO 200 that does not comply with target performance criteria for phase noise. In FIG. 2, the first LC-based VCO 200 includes a first pair of CMOS transistors (MP1 and MN1) and a second pair of CMOS transistors (MP2 and MN2) in a cross-coupled arrangement. More specifically, with the cross-coupled arrangement, the drains of MP1 and MN1 are coupled to each other. Also, the control (gate) terminals of MP1 and MN1 are coupled to each other. Similarly, the drains of MP2 and MN2 are coupled to each other. Also, the control (gate) terminals of MP2 and MN2 are coupled to each other. As shown, the emitters of MP1 and MP2 are coupled to a supply voltage (VDD) terminal 206, where VDD=1.2V in the example of FIG. 1. Also, the emitters of MN1 and MN2 are coupled to a ground terminal 208.

In the example of FIG. 2, an LC circuit 210 is coupled between a first differential output (VOP) terminal 202 and a second differential output (VON) terminal 204 of the first LC-based VCO 200. As shown, the VOP terminal 202 is coupled to the drains of MP1 and MN1, and is to the coupled to the control (gate) terminals of MP2 and MN2. Also, the VON terminal 204 is coupled to the drains of MP2 and MN2, and to the control (gate) terminals of MP1 and MN1. In scenario 218 of FIG. 2, the first LC-based VCO 200 is not in operation. In scenario 220 of FIG. 2, the first LC-based VCO 200 is clamped between a supply voltage (VDD, e.g., 1.2V provided by the VDD terminal 306) and the ground terminal 208 (VSS, e.g., 0V).

With the first LC-based VCO 200, a set of target performance parameters are considered, such as small signal noise (Gm*RP, where Gm is the transconductance of the first LC-based VCO 200 and RP is the losses of the LC circuit 210), phase noise (measured using a signal-to-noise ratio or "SNR"), output swing, power consumption (V*I), and complexity. In the example of FIG. 1, a high-voltage swing is able to reduce phase noise. When the VOP terminal 202 is at 0V and the VON terminal 204 is at 1.2V as in scenario 220, the LC circuit 210 is clamped to the supply rails VDD and VSS via MP2 and MN1, which limits the complete operation of the LC circuit 210 and negatively impacts the phase noise and frequency stability. In sub-micron technologies with an on-chip LC circuit, the quality factor (Q) for the VCO is approximately 10, this makes the sizes of the cross-coupled CMOS pairs (MN1, MN2; and MP1 and MP2) relatively large. Table 1 shows simulation results for the first LC-based VCO 200.

TABLE 1

| ~12 GHz VCO With L = 143 pH and Q = 10 (Simulation Results) | Weak Corner | | Strong Corner | |
| --- | --- | --- | --- | --- |
| | −40° C. | 125° C. | −40° C. | 125° C. |
| Freq [MHz] | 11457 | 11404 | 11461 | 11587 |
| Phase Noise @ 1 MHz offset [dBc/Hz] | −106.4 | −106.0 | −105.0 | −107.6 |
| Amplitude of Oscillation [$V_{PP}$] | 1.03 | 0.97 | 1.39 | 1.34 |
| Freq Drift with regard to temp [MHz] | −53 | | 126 | |

In Table 1, a VCO with a 12 GHz output is assumed, where L=143 pH and Q=10. As represented in Table 1, the frequency drift in the "strong process corner" and the "weak process corner" are in opposite directions. This is due to strong clamping in the strong corner. Due to at least the frequency drift across the temperature range being larger than desired, and thus the first LC-based VCO 200 does not comply with target performance criteria.

Figure 3:
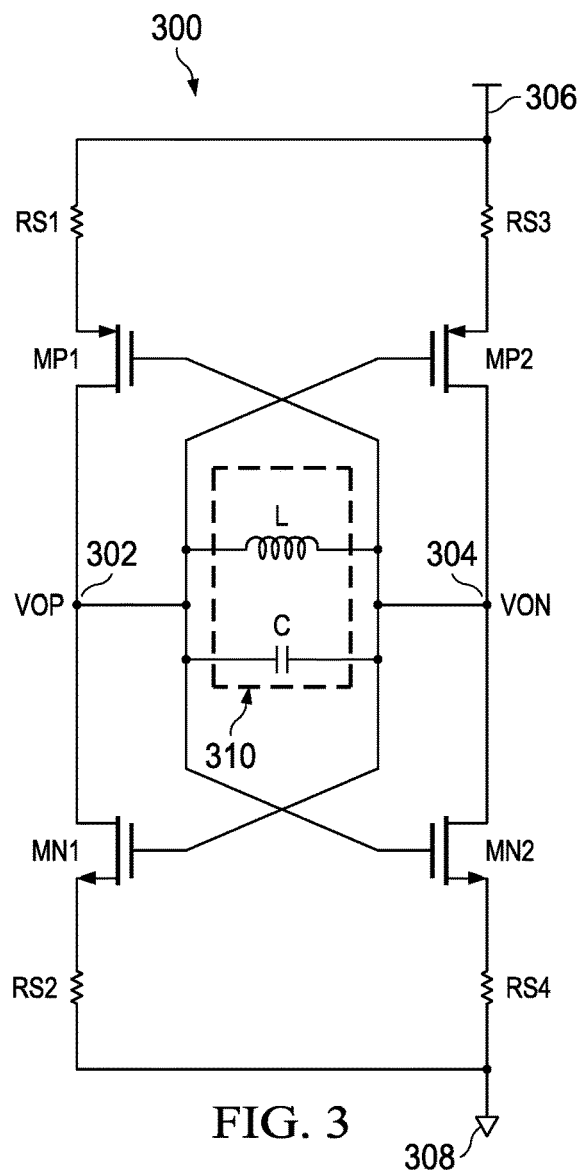
FIG. 3 is a block diagram showing a second LC-based VCO that does not comply with target performance criteria.

FIG. 3 is a block diagram showing a second LC-based VCO 300 that does not comply with target performance criteria. The second LC-based VCO 300 has the same cross-couple arrangement of the first pair of CMOS transistors (MP1, MN1) and the second pair of CMOS transistors (MP2, MN2) as described for the first LC-based VCO 200. As shown in FIG. 3, an LC circuit 310 is coupled between a VOP terminal 302 and a VON terminal 304 of the second LC-based VCO 300. In the example of FIG. 3, resistors (e.g., RS1 and RS3) are used between a supply voltage terminal 306 and the emitters of MP1 and MP2. More specifically, RS1 is between the source of MP1 and the supply voltage 306, and RS3 is between the source of MP2 and the supply voltage terminal 306. Also, resistors (e.g., RS2 and RS4) are used between the sources of MN1 and MN2 and a ground terminal 308. More specifically, RS2 is between the source of MN1 and the ground terminal 308, and RS4 is between the source of MN2 and the ground terminal 308.

With the second LC-based VCO 300, the small signal gain and the output swing are undesirably reduced relative to the small signal gain and output swing of the first LC-based VCO 200 in FIG. 2. Also, the power consumption for the second LC-based VCO 300 is undesirably increased relative to the power consumption for the first LC-based VCO 200. One advantage of the second LC-based VCO 300 relative to the first LC-based VCO 200 is that phase noise is reduced. Also, the complexity of the second LC-based VCO 300 relative to the first LC-based VCO 200 is acceptable. Due to at least the small signal gain, output swing, and power consumption issues, the second LC-based VCO 300 does not comply with target performance criteria.

Figure 4:
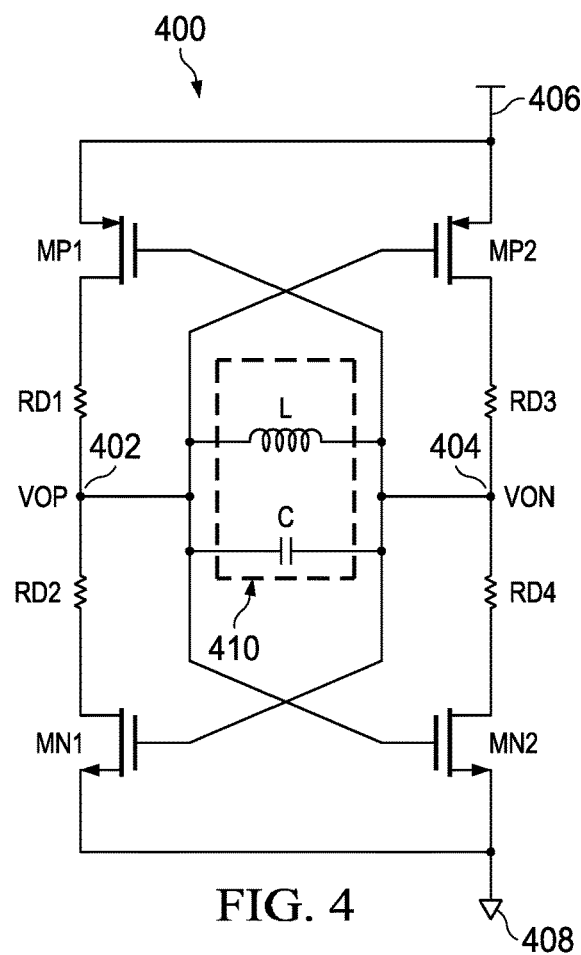
FIG. 4 is a block diagram showing a third LC-based VCO that does not comply with target performance criteria.

FIG. 4 is a block diagram showing a third LC-based VCO 400 that does not comply with target performance criteria. The third LC-based VCO 400 has the same cross-couple arrangement of the first pair of CMOS transistors (MP1, MN1) and the second pair of CMOS transistors (MP2, MN2) as described for the first LC-based VCO 200. As shown in FIG. 4, an LC circuit 410 is coupled between a VOP terminal 402 and a VON terminal 404 of the third LC-based VCO 400. In the example of FIG. 4, resistors (e.g., RD1 and RD2) are used between the VOP terminal 402 and the drains of MP1 and MN1. More specifically, RD1 is between the VOP terminal 402 and the drain of MP1, and RD2 is between the VOP terminal 402 and the emitter of MN1. Also, resistors (e.g., RD3 and RD4) are used between the VON terminal 404 and the drains of MP2 and MN2. More specifically, RD3 is between the VON terminal 404 and the drain of MP2, and RD4 is between the VON terminal 404 and the drain of MN2.

With the third LC-based VCO 400, the small signal gain is the same relative to the first LC-based VCO 200. Also, the output swing of the third LC-based VCO 400 is undesirably decreased relative to the output swing of the first LC-based VCO 200. Also, the power consumption of the third LC-based VCO 400 is undesirably increased relative to the power consumption of the first LC-based VCO 200. One advantage of the third LC-based VCO 400 relative to the first LC-based VCO 200 is that phase noise is reduced. Also, the complexity of the third LC-based VCO 400 relative to the first LC-based VCO 200 is acceptable. Due to at least the power consumption being higher third LC-based VCO 400 does not comply with target performance criteria as the power consumption is higher than desired.

Figure 5:
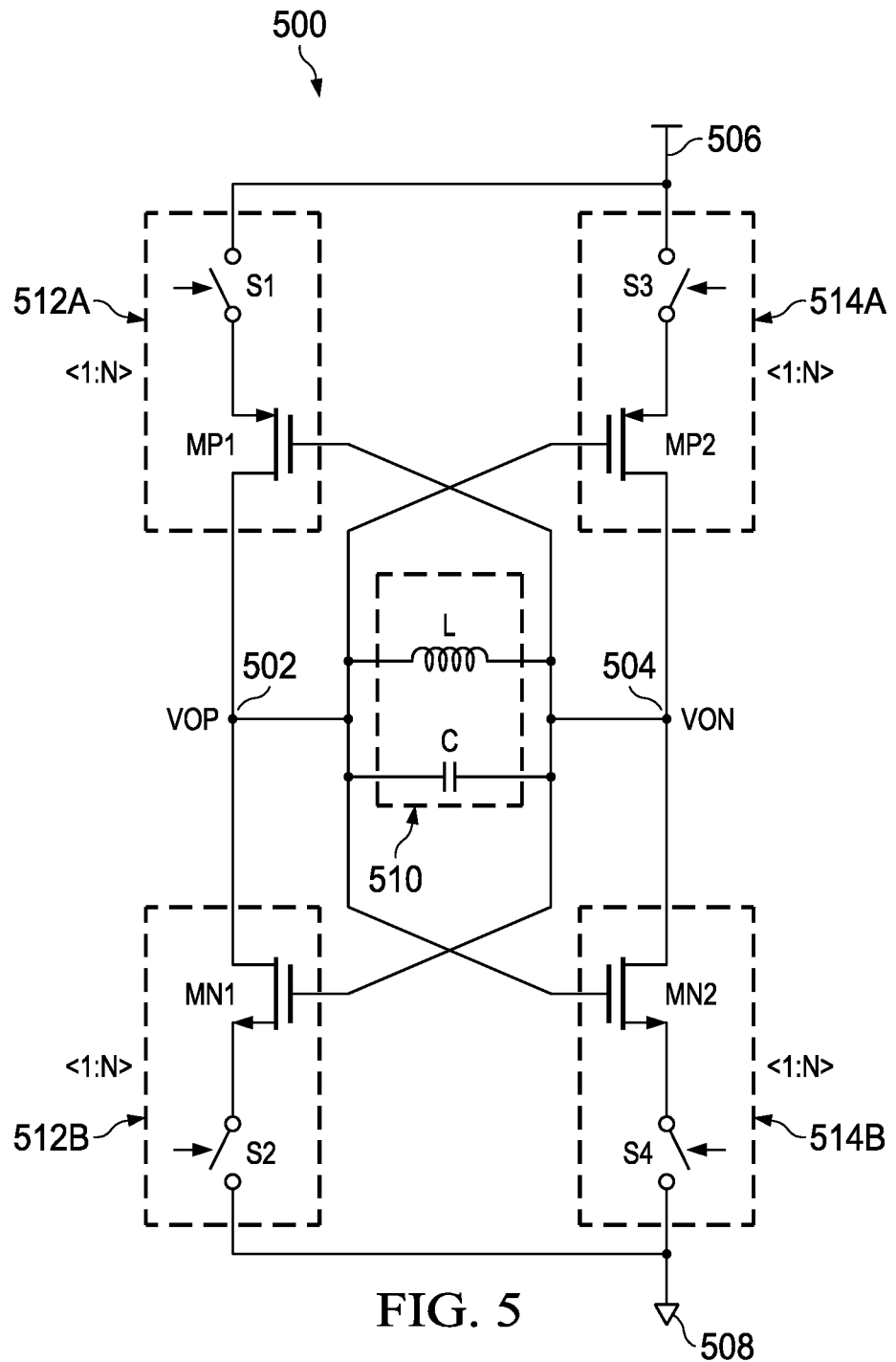
FIG. 5 is a block diagram showing a fourth LC-based VCO that does not comply with target performance criteria.

FIG. 5 is a block diagram showing a fourth LC-based VCO 500 that does not comply with target performance criteria. The fourth LC-based VCO 500 has the same cross-couple arrangement of the first pair of CMOS transistors (MP1, MN1) and the second pair of CMOS transistors (MP2, MN2) as described for the first LC-based VCO 200. As shown in FIG. 5, an LC circuit 510 is coupled between a VOP terminal 502 and a VON terminal 504 of the fourth LC-based VCO 500. In the example of FIG. 5, the resistance of MP1, MN1, MP2, and MN2 is adjustable as represented by the adjustable transistor circuit 512A (with MP1 and switch S1), the adjustable transistor circuit 512B (with MN1 and switch S2), the adjustable transistor circuit 514A (with MP2 and switch S3), and the adjustable transistor circuit 514B (with MN2 and switch S4). In some examples, the size of the transistors are chosen in such a way that the targeted output swing is reached using a calibration algorithm By adjusting the resistance of MP1, MN1, MP2, MN2, the performance of the fourth LC-based VCO 500 relative to the first LC-based VCO 200 at the cost of increased complexity.

With the fourth LC-based VCO 500, the small signal gain, the output switch, and the power consumption are optimized relative to the first LC-based VCO 200. Also, the phase noise of the fourth LC-based VCO 500 is reduced relative to the phase noise of the first LC-based VCO 200. Unfortunately, the complexity of the fourth LC-based VCO 500 is high relative to the first LC-based VCO 200. At least due to the complexity of the fourth LC-based VCO 500 and related costs, the fourth LC-based VCO 500 does not comply with target performance criteria.

Figure 6:
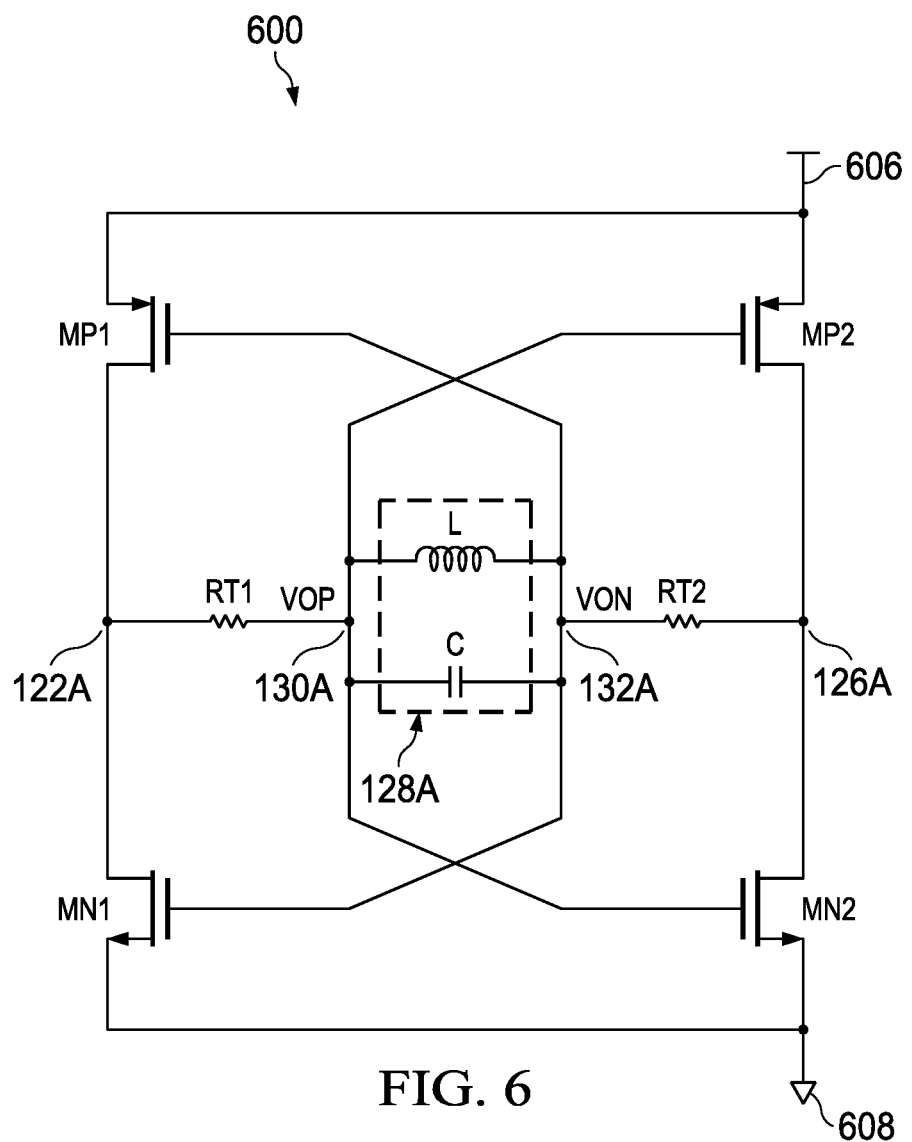
FIG. 6 is a block diagram showing an LC-based VCO that complies with target performance criteria.

FIG. 6 is a block diagram showing an LC-based VCO 600 that complies with target performance criteria. The LC-based VCO 600 has the same cross-couple arrangement of the first pair of CMOS transistors (MP1, MN1) and the second pair of CMOS transistors (MP2, MN2) as described for the first LC-based VCO 200. As shown in FIG. 6, an LC circuit 620 is coupled between a VOP terminal 130A (an example of the first differential output terminal 130 in FIG. 1) and a VON terminal 132A (an example of the second differential output terminal 132 in FIG. 1) of the LC-based VCO 600. As shown, the LC-based VCO 600 includes a first terminal 122A (an example of the first terminal 122 in FIG. 1) between drain terminals of the first pair of CMOS transistors (MP1, MN1). The LC-based VCO 600 also includes a second terminal 126A (an example of the second terminal 126 in FIG. 1) between drain terminals of the second pair of CMOS transistors (MP2, MN2). The LC-based VCO 600 also includes RT1, an LC circuit 128A (an example of the LC circuit 128 in FIG. 1), and RT2 coupled in series between the first and second terminals 122A and 126A. More specifically, RT1 is between the first terminal 122A and the VOP terminal 130A, and RT2 is between the second terminal 126A and the VON terminal 132A. With RT1 and RT2 in series with the LC circuit 128, surge protection is provided, which ensures the LC-based VCO 600 complies with target performance criteria such as frequency drift as a function of temperature variation, phase noise, and small signal gain.

More specifically, with the LC-based VCO 600, the small signal gain is the same as the small signal of the first LC-based VCO 200. Also, the phase noise and power consumption of the LC-based VCO 600 are reduced relative to the first LC-based VCO 200. One disadvantage of the LC-based VCO 600 is that the output swing is reduced relative to the first LC-based VCO 200. Finally, the complexity of the LC-based VCO 600 is acceptable relative to the first LC-based VCO 200. Table 2 shows simulation results for the LC-based VCO 200.

TABLE 2

| ~12 gHz VCO with | Cross-Couple CMOS pairs with Surge Protection | | | |
|---|---|---|---|---|
| L = 143 pH and Q = 10<br>RT1 = RT2 = 8Ω | Weak Process Corner | | Strong Process Corner | |
| (Simulation Results) | −40° C. | 125° C. | −40° C. | 120° C. |
| Freq [MHz] | 11520 | 11435 | 11875 | 11865 |
| Phase Noise @ 1 MHz offset [dBc/Hz] | −111.3 | −109.4 | −116.3 | −113.5 |
| Amplitude of Oscillation [$V_{PP}$] | 0.83 | 0.76 | 1.21 | 1.14 |
| Supply Current [A] | 10.1E-3 | 10.7E-3 | 26.2E-3 | 27.0E-3 |
| Freq drift with temp [MHz] | −85 | | −9 | |

In Table 2, a VCO with a 12 GHz output is assumed, where L=143 pH and Q=10. RT1 and RT2 is sized according to the minimal acceptable output swing that can be tolerated (in this example RT1 and RT2 are set at 80). As represented in Table 2, the frequency drift in the "strong process corner" and the "weak process corner" are in the same direction. Based on the simulation results represented in Table 2, the frequency drift of the LC-based VCO 600 across the temperature range is acceptable.

With the LC-based VCO 600 phase noise is reduced by at 2 dB relative to the first LC-based VCO 200 when compared across corners without increasing the current consumption. The value of RT1 and RT2 should be chosen so that RT1 and RT2 do not cause lot of degradation to output swing, especially with slow corners where the supply voltage and MOSFET Gm will be less.

In some examples, a system (e.g., the system 100 in FIG. 1) includes a data path (e.g., the data path 103 in FIG. 1), a PLL (e.g., the PLL 111 in FIG. 1), and a VCO (e.g., the VCO 118 in FIG. 1, or the LC-based VCO 600 in FIG. 6) coupled to the PLL. The VCO includes an LC circuit (e.g., the LC circuit 128 in FIG. 1, or the LC circuit 128A in FIG. 6) with first and second differential output terminals (e.g., VOP terminal 130 and VON terminal 132 in FIG. 1; or VOP terminal 130A and VON terminal 132A in FIG. 6). The VCO also includes a first resistor (RT1 in FIGS. 1 and 6) coupled between the first differential output terminal and drain terminals of a first pair of CMOS transistors (120 in FIG. 1, or MP1, MN1 in FIG. 6). The VCO also includes a second resistor (RT2) coupled between the second differential output terminal and drain terminals of a second pair of CMOS transistors.

In some examples, the first pair of CMOS transistors includes a first PMOS transistor (e.g., MP1 in FIG. 6) with a gate terminal coupled to the second differential output terminal (e.g., VON terminal 132 in FIG. 1, or VON terminal 132A in FIG. 6), wherein an emitter terminal of the first PMOS transistor is coupled to a supply voltage terminal (e.g., the VDD terminal 606 in FIG. 6). The first pair of CMOS transistors also includes a first NMOS transistor (e.g., MN1 in FIG. 6) with a gate terminal coupled to the second differential output terminal, wherein an emitter terminal of the first NMOS transistor is coupled to a ground terminal (e.g., the ground terminal 608 in FIG. 6).

In some examples, the second pair of CMOS transistors includes a second PMOS transistor (e.g., MP2 in FIG. 6) with a control (gate) terminal coupled to the first differential output terminal (e.g., VOP terminal 130 in FIG. 1, or the VOP terminal 130A in FIG. 6), wherein an emitter terminal of the second PMOS transistor is coupled to the supply voltage terminal (e.g., the VDD terminal 606 in FIG. 6). The second pair of CMOS transistors also includes a second NMOS transistor (MN2) with a gate terminal coupled to the first differential output terminal, wherein an emitter terminal of the second NMOS transistor is coupled to the ground terminal (e.g., the ground terminal 608 in FIG. 6).

In some examples, a VCO (e.g., the VCO 118 in FIG. 1, or the LC-based VCO 600 in FIG. 6) includes a first pair of CMOS transistors (e.g., MP1, MN1 in FIG. 6) with a first terminal (e.g., 122A in FIG. 6) between drain terminals of the first pair of CMOS transistors. The VCO also includes a second pair of CMOS transistors (e.g., MP2, MN2 in FIG. 6) with a second terminal 126A between drain terminals of the second pair of CMOS transistors. The VCO also includes a first resistor, an LC circuit, and a second resistor coupled in series (e.g., RT1, LC circuit 128A, and RT2 in series in FIG. 6) between the first and second terminals. The VCO also includes a first differential output terminal (e.g., 130A in FIG. 6) between the first resistor and the LC circuit, and a second differential output terminal (e.g., 132A in FIG. 6) between the second resistor and the LC circuit.

In some examples, a size of the first and second pairs of CMOS transistors is selected to achieve a high quality factor (e.g., 10 or more). Also, in some examples, a supply voltage source is configured to provide a supply voltage to the supply voltage source, where the supply voltage is between 1V to 1.2V. In some examples, the first and second resistors are sized so that the VCO achieves a target small signal gain and a target phase noise. In some examples, the data path, the PLL, and the VCO are components of an integrated circuit based on a CO21 (65 nm) process. In some examples, the small signal gain for the described VCO is greater than 1 (e.g., around 2).

With the described VCO topology, the feedback to cross-coupled CMOS pairs prevents the degradation of small signal gain. In some examples, two resistors (RT1 and RT2) are in series with the LC circuit or tank to limit the current. The introduction of RT1 and RT2 reduces phase noise by at least 2 dB without increasing current consumption. Also, in some examples, the value of RT1 and RT2 is chosen such that output switch degradation is avoided, especially with slow corner where the supply voltage and MOSFET transconductance will be less. With the described VCO topology, the small signal gain is the same as the small signal of the first LC-based VCO 200. Also, the phase noise and power consumption of the described VCO are reduced relative to the first LC-based VCO 200. One disadvantage of the described LC-based VCO is that the output swing is reduced relative to the first LC-based VCO 200. Finally, the complexity of the described VCO is acceptable relative to the first LC-based VCO 200. When compared with other VCO topologies, the described VCO topology meets more target performance criteria without a significant increase in complexity (e.g., reducing size and cost compared to the fourth LC-based VCO in FIG. 4).

The term "couple" is used throughout this description. The term may cover connections, communications, or signal paths that enable a functional relationship consistent with this description. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Modifications are possible in the described embodiments, and other embodiments are possible, within the scope of the claims.

What is claimed is:

1. A system, comprising:
   a data path;
   a clock and data recovery (CDR) circuit coupled to the data path, the CDR circuit having a phase-locked loop (PLL) with a voltage-controlled oscillator (VCO), wherein the VCO includes:
   an LC circuit having a first terminal and a second terminal, wherein the LC circuit includes an inductor and capacitor, wherein the inductor is coupled between the first terminal of the LC circuit and the second terminal of the LC circuit, and the capacitor is coupled between the first terminal of the LC circuit and the second terminal of the LC circuit;
   a first resistor coupled between a first differential output terminal and the first terminal of the LC circuit; and
   a second resistor coupled between a second differential output terminal and the second terminal of the LC circuit.

2. The system of claim 1 further comprising a first pair of CMOS transistors, wherein the first pair of CMOS transistors comprises:
   a first PMOS transistor with a gate terminal coupled to the second differential output terminal, wherein a source terminal of the first PMOS transistor is coupled to a supply voltage terminal; and
   a first NMOS transistor with a gate terminal coupled to the second differential output terminal, wherein a source terminal of the first NMOS transistor is coupled to a ground terminal.

3. The system of claim 2 further comprising a second pair of CMOS transistors, wherein the second pair of CMOS transistors comprises:
   a second PMOS transistor with a gate terminal coupled to the first differential output terminal, wherein a source terminal of the second PMOS transistor is coupled to the supply voltage terminal; and
   a second NMOS transistor with a gate terminal coupled to the first differential output terminal, wherein a source terminal of the second NMOS transistor is coupled to the ground terminal.

4. The system of claim 1, wherein the data path and the CDR circuit are part of a communication link device.

5. The system of claim 4, wherein the communication link device is a serializer/de-serializer.

6. The system of claim 1, wherein a size of the first and second pairs of CMOS transistors is selected to a quality factor of 10 or more.

7. The system of claim 2, wherein a supply voltage provided by the supply voltage terminal is between 1V to 1.2V.

8. The system of claim 1, wherein the data path and the CDR circuit are components of an integrated circuit.

9. The system of claim 1, wherein the first and second resistors are sized so that the VCO achieves a small signal gain greater than 1.

10. An integrated circuit, comprising:
    a voltage-controlled oscillator (VCO) comprising:
    a first differential output terminal;
    a second differential output terminal;
    an LC circuit having a first terminal and a second terminal, wherein the LC circuit includes an inductor and capacitor, wherein the inductor is coupled between the first terminal of the LC circuit and the second terminal of the LC circuit, and the capacitor is coupled between the first terminal of the LC circuit and the second terminal of the LC circuit;
    a first resistor coupled between the first differential output terminal and the first terminal of the LC circuit; and
    a second resistor coupled between the second differential output terminal and the second terminal of the LC circuit.

11. The integrated circuit of claim 10 further comprising a first pair of CMOS transistors and a second pair of CMOS transistors,
    wherein the first pair of CMOS transistors comprises:
    a first PMOS transistor with a gate terminal coupled to the second differential output terminal, wherein a source terminal of the first PMOS transistor is coupled to a supply voltage terminal; and
    a first NMOS transistor with a gate terminal coupled to the second differential output terminal, wherein a source terminal of the first NMOS transistor is coupled to a ground terminal, and
    wherein the second pair of CMOS transistors comprises:
    a second PMOS transistor with a gate terminal coupled to the first differential output terminal, wherein a source terminal of the second PMOS transistor is coupled to the supply voltage terminal; and
    a second NMOS transistor with a gate terminal coupled to the first differential output terminal, wherein a source terminal of the second NMOS transistor is coupled to the ground terminal.

12. The integrated circuit of claim 11, wherein a size of the first and second pairs of CMOS transistors is selected to achieve a quality factor of at least 10, and wherein the first and second resistors are sized so that the VCO achieves a small signal gain greater than 1.

* * * * *